(12) United States Patent
Pham et al.

(10) Patent No.: US 7,385,435 B2
(45) Date of Patent: Jun. 10, 2008

(54) PROGRAMMABLE POWER GATING CIRCUIT

(75) Inventors: Giao Pham, Portland, OR (US); Nintunze Novat, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 11/478,394

(22) Filed: Jun. 29, 2006

(65) Prior Publication Data

US 2008/0001655 A1    Jan. 3, 2008

(51) Int. Cl.
*G05F 1/10* (2006.01)
(52) U.S. Cl. ..................................... 327/534
(58) Field of Classification Search ................ 327/530, 327/534, 535, 537
See application file for complete search history.

(56) References Cited

U.S. PATENT DOCUMENTS

| | | | | |
|---|---|---|---|---|
| 5,880,604 A * | 3/1999 | Kawahara et al. | ............ | 326/83 |
| 6,049,245 A * | 4/2000 | Son et al. | .................... | 327/544 |
| 6,285,230 B1 * | 9/2001 | Na | ............... | 327/277 |
| 6,326,837 B1 * | 12/2001 | Matano | ..................... | 327/545 |
| 6,552,596 B2 * | 4/2003 | Cowles et al. | .............. | 327/318 |
| 6,833,748 B2 * | 12/2004 | Cho | ............................ | 327/374 |
| 7,190,209 B2 * | 3/2007 | Kang et al. | ................. | 327/534 |
| 7,271,628 B2 * | 9/2007 | Cowles | ........................ | 327/108 |

* cited by examiner

*Primary Examiner*—Jeffrey S Zweizig
(74) *Attorney, Agent, or Firm*—Douglas J. Ryder; Ryder IP Law, PC

(57) ABSTRACT

In general, in one aspect, the disclosure describes a programmable power gating circuit that includes a reference voltage generator to generate a reference voltage and a voltage selector, coupled between a voltage source and active circuitry, to gate application of the voltage source to the active circuitry and provide a certain voltage to the active circuitry when the active circuitry is in a reduced capacity mode. The certain voltage is based on the reference voltage.

16 Claims, 7 Drawing Sheets

US 7,385,435 B2

PROGRAMMABLE POWER GATING CIRCUIT

BACKGROUND

Integrated circuits (ICs), such as microprocessors, continue to increase circuit densities to support higher levels of performance and functionality. The growth in transistor density has resulted in transistors having shorter gate lengths while power supply voltages have not been scaled as much. The increase in performance may include an increase in clock speeds and accordingly an increase in the power required to operate the ICs. Increases in speed and power and decreases in gate size and operating voltage result in increased currents. Leakage power is becoming an increasing ratio of the total power, and ways to lessen its impact are needed. One solution is to lower or shut down the supply voltage when it is not needed, thus saving power. For example, in a multi-core platform individual cores may be shutdown when not needed (e.g., when in a sleep mode).

FIG. 1 illustrates an example prior art schematic of a power gating circuit for controlling power to a core logic circuit 100. The gating circuit includes a power gate transistor 110 (e.g., PMOS) placed between a voltage source ($V_{cc}$) 120 and the core logic circuit 100. A 'sleep' signal is received at an input 130 and is provided to a gate of the power gate transistor 110 to control the operation of the power gate transistor 110 and application of the $V_{cc}$ 120 to the core 100. The power gate transistor 110 provides a virtual supply voltage ($V_{ccv}$) 140 to the core 100. During an ON-state the $V_{ccv}$ 140 supplied to the core 100 may be approximately the $V_{cc}$ 120 and during an OFF-state the $V_{ccv}$ 140 supplied to the core 100 may be set by the final steady state of the leakage between the power gate transistor 110 and the core 100.

Utilizing the power gate transistor 110 to control the $V_{ccv}$ 140 provided to the core 100 during a sleep mode may not be optimum. For example, during a sleep mode the power gate transistor 110 may supply such a low voltage that states in the core 100 are wiped out. Accordingly, the states may need to be saved in some external registers that may require a special architectural design and complex circuitry. Moreover, it may take a significant amount of dynamic power and many clock cycles to restart the core 100. After the core 100 is restarted the states may need to be reloaded to the core 100 from the external registers before normal operations may begin. The sequence for restarting the core 100 may become more complex in multi-core designs where one core can be slept while other cores are in normal operation.

Furthermore, the power specification is imprecise as the $V_{ccv}$ 140 is floating (the level is set by some balance reached between the leakage through the power gating device and the core leakage) when the IC is in sleep mode.

BRIEF DESCRIPTION OF THE DRAWINGS

The features and advantages of the various embodiments will become apparent from the following detailed description in which.

DETAILED DESCRIPTION

Figure 1:
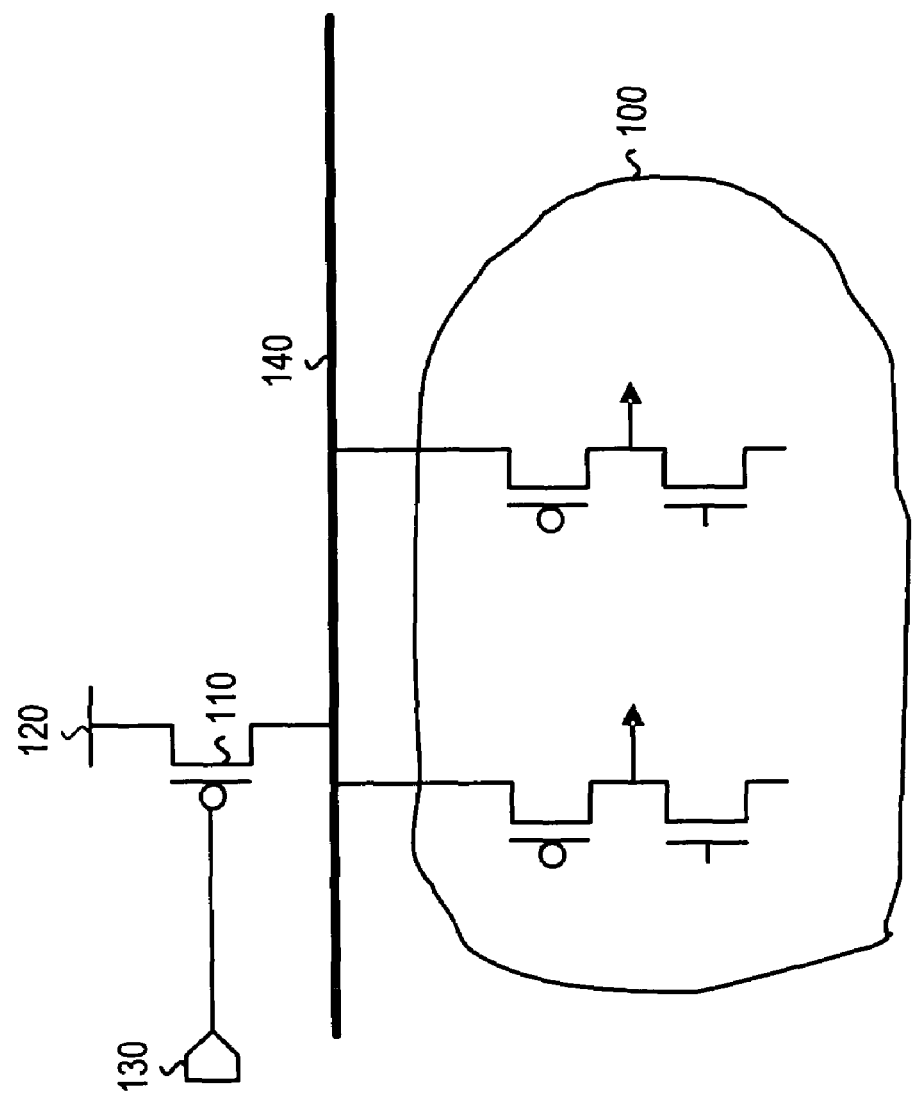
FIG. 1 illustrates a schematic of an example prior art power gating circuit.
Figure 1A:
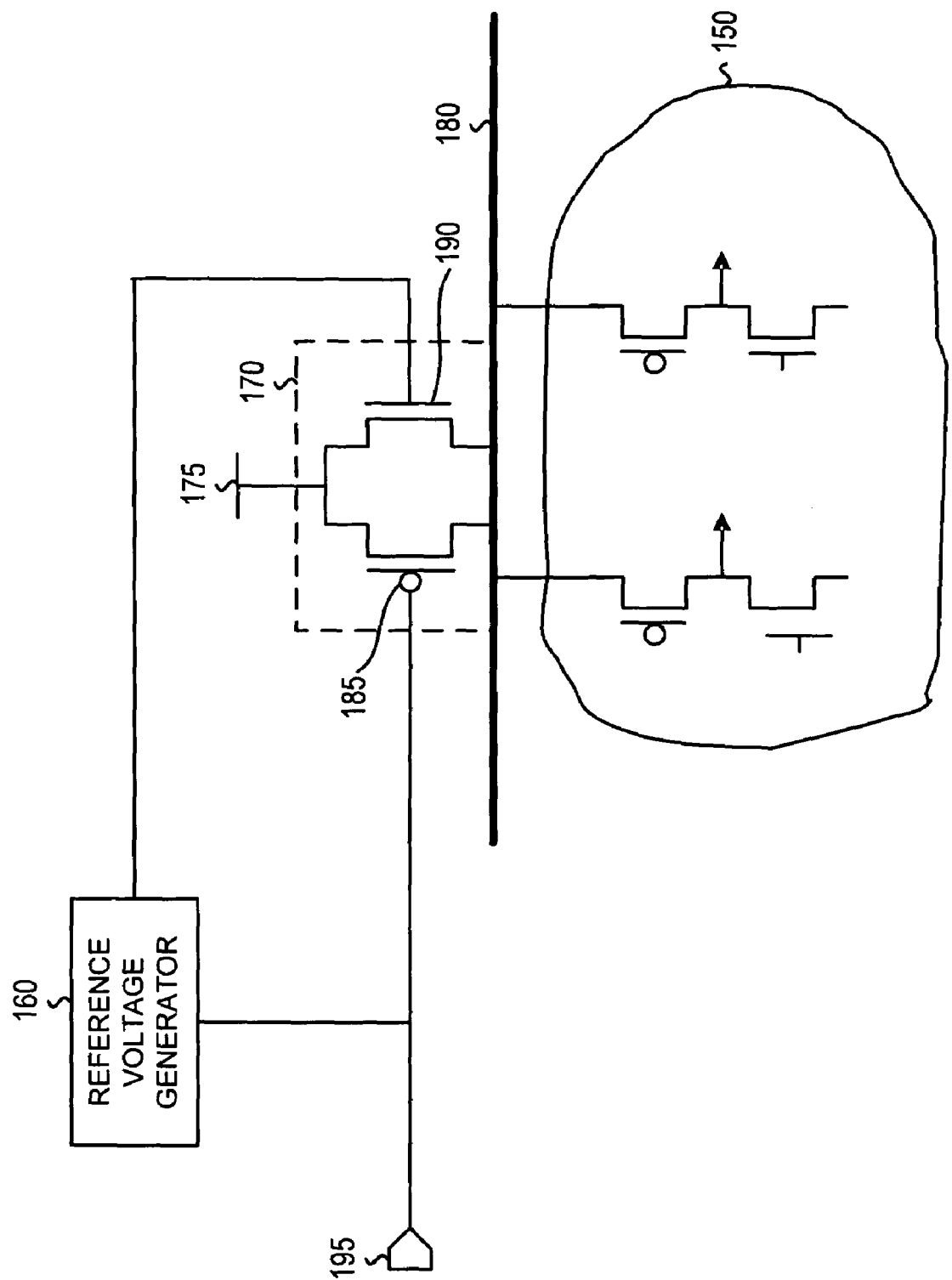
FIG. 1A illustrates an example programmable power gating circuit, according to one embodiment.

FIG. 1A illustrates an example programmable power gating circuit for controlling power to active circuitry (e.g., logic core) 150. The circuit may include a reference voltage generator 160 and a voltage selector 170. The voltage selector 170 may be coupled to a voltage source ($V_{cc}$) 175 and the core logic circuit 150 and may provide a different voltage to the core 150 depending on the mode of the core 150 (thus providing a virtual supply voltage ($V_{ccv}$) 180) to the core 150. The voltage selector 170 may include a power transistor 185 (e.g., PMOS) and a sleep transistor 190 (e.g., NMOS) in parallel. The circuit may include an input 195 to receive a signal capable of indicating when the core 150 is in a reduced capacity mode (e.g., sleep). Hereinafter the signal received at the input 195 will be referenced as sleep signal 195. The sleep signal 195 may be provided to the power transistor 185 and to the reference voltage generator 160.

If the sleep signal 195 is active indicating that the core 150 is in sleep mode the power transistor 185 may be OFF thus gating the voltage source 175 from being provided to the core 150. In addition, the reference voltage generator 160 may generate a programmable reference voltage to be applied to the sleep transistor 190 and may turn ON the sleep transistor 190. When the sleep transistor 190 is ON it may apply a certain voltage to the core 150 based on the reference voltage provided. If the sleep signal 195 is inactive indicating the core 150 is not in sleep (e.g., in active mode) the power transistor 185 may be ON thus applying the voltage source 165 to the core 150. In addition, the reference voltage generator 160 may not generate a reference voltage so that the sleep transistor 190 may be OFF.

Figure 2:
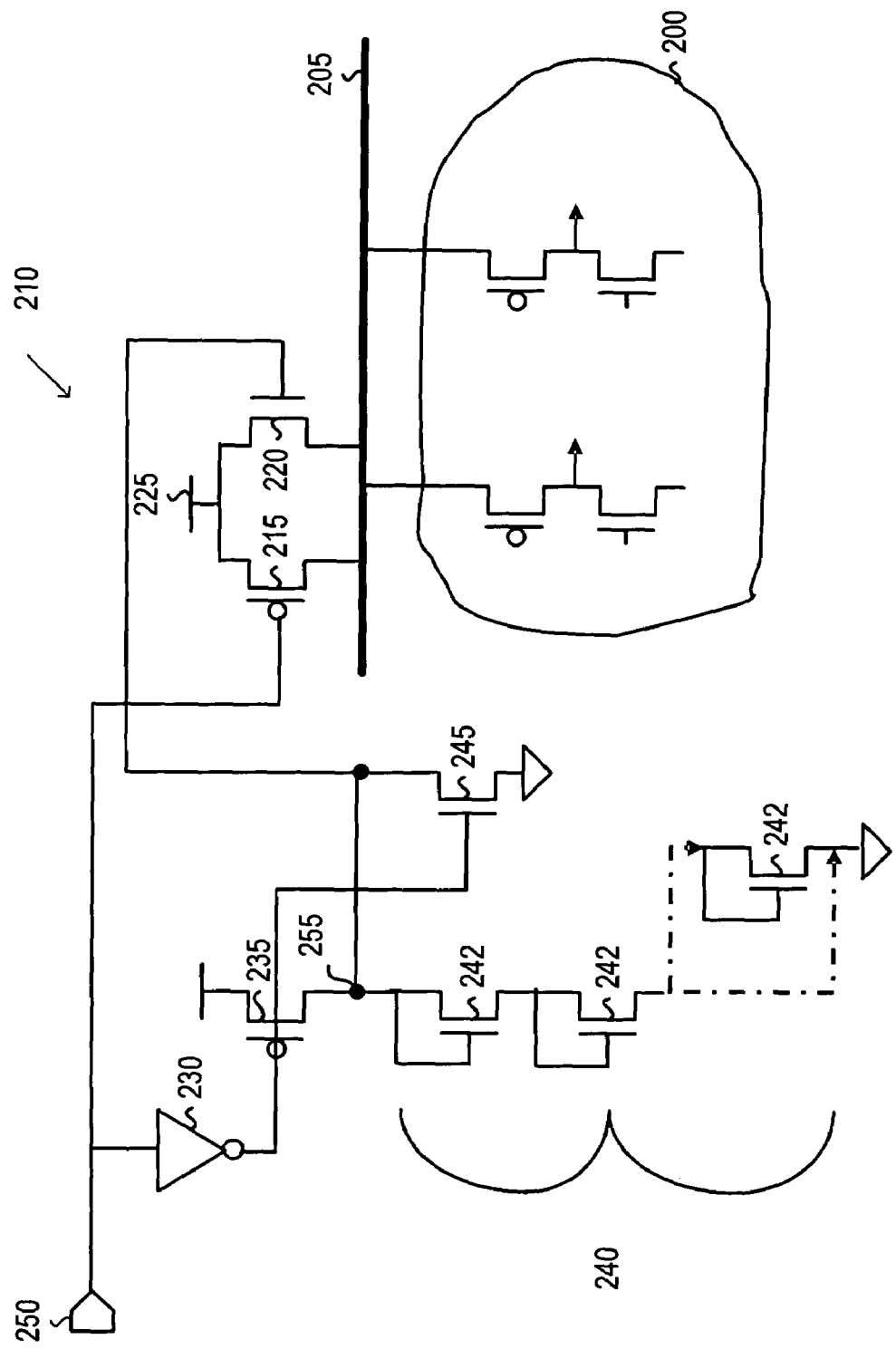
FIG. 2 illustrates a schematic of an example programmable power gating circuit, according to one embodiment.

FIG. 2 illustrates a schematic of an example programmable power gating circuit 210 for controlling power to a circuit logic core 200. The circuit 210 may include a voltage selector (e.g., 170 of FIG. 1). The voltage selector may include a power transistor 215 (e.g., PMOS) and a sleep transistor 220 (e.g., NMOS) in parallel between a voltage source ($V_{cc}$) 225 and the core logic circuit 200. The parallel transistors 215, 220 may provide a virtual supply voltage ($V_{ccv}$) 205 to the core 200. The circuit 210 may further include a reference voltage generator (e.g., 160 of FIG. 1). The reference voltage generator may include a stack 240 of reference voltage transistors 242 (e.g., NMOS) connected as diodes. The circuit 210 may further include an inverter 230, a sleep initialization transistor 235 (e.g., PMOS) and a sleep disable transistor 245 (e.g., NMOS). The sleep initialization transistor 235 and the sleep disable transistor 245 may be part of the reference voltage generator.

A reduced capacity (e.g., sleep) signal is received at an input 250 (hereinafter signal received at input 250 will be referenced as sleep signal 250) may be provided to a gate of the power transistor 215 and the inverter 230. The inverted sleep signal may be provided to the sleep initialization transistor 235 and the sleep disable transistor 245. The stack 240 of transistors 242 generate a reference voltage ($V_{ref}$) 255

(actual voltage not illustrated, rather for simplicity a node having the voltage is simply illustrated) based on the current path in the stack 240 which is based on the threshold voltages ($V_{tn}$) of the transistors 242. The stack 240 may be connected to a gate of the sleep transistor 220. The number (N) of transistors 242 in the stack 240 controls the $V_{ref}$ 255 so that the $V_{ref}$ 255 is programmable based on N (e.g., $V_{ref}=3V_{tn}$ if N=3). The application of the $V_{ref}$ to the sleep transistor 220 is controlled by the sleep initialization transistor 235 and the sleep disable transistor 245.

The sleep signal 250 controls operation of the power transistor 215, the sleep initialization transistor 235, and the sleep disable transistor 245. When the IC is in active mode the sleep signal 250 is inactive (e.g., set to 0), the sleep signal 250 activates the power transistor 215 (ON state) and the inverted sleep signal activates the sleep disable transistor 245 (ON state) and deactivates the sleep initialization transistor 235 (OFF state). Accordingly, the gate of the sleep transistor 220 is tied to ground via the sleep disable transistor 245 and is deactivated (OFF state). The $V_{cc}$ 205 is provided via the power transistor 215 and may be approximately the $V_{cc}$ 225. The $V_{ccv}$ 205 is supplied to the core 200.

When the IC is in sleep mode the sleep signal 250 is active (e.g., set to '1'), the sleep signal deactivates the power transistor 215 (OFF state) and the inverted sleep signal deactivates the sleep disable transistor 245 (OFF state) and activates the sleep initialization transistor 235 (ON state). Accordingly, the $V_{ref}$ 255 is applied to the gate of the sleep transistor 220. The $V_{ccv}$ 205 may be provided via the sleep transistor 220 and may be $V_{ref}$ 255 reduced by the $V_{tn}$ of the sleep transistor 220 ($V_{ref}-V_{tn}$).

In order to provide a sufficient $V_{ccv}$ 205 (e.g., $V_{tn}$) during sleep mode the $V_{ref}$ may be at least $2V_{tn}$ (2 transistors 242 in the stack 240) to account for the reduction of $V_{tn}$ of the sleep transistor 220. Each additional transistor 242 in the stack 240 increases the $V_{ccv}$ 205 applied to the core 200 by $V_{tn}$. As illustrated, the upper two transistors 242 in the stack 240 are connected via dashed lines to the bottom transistor 242 of the stack 240 as well as to ground to show that the inclusion of the bottom transistor 242 may be optional and the number of transistors 242 used in the stack 240 is variable. If the top two transistors 242 were connected to ground the $V_{ref}$ 255 generated by the stack 240 would be $2V_{tn}$, while if the third transistor 242 was connected to the stack 240 the $V_{ref}$ 255 generated by the stack 240 would be $3V_{tn}$. The bottom transistor 242 (e.g., the optional transistor) may be any number of transistors 242. The choice of how many transistors 242 to use in the stack 240 depends on the $V_{ccv}$ 205 to be applied to the core logic 200 for the particular operational state of the core logic 200.

The circuit 210 provides a predictable $V_{ccv}$ 205 that may be reliably generated in a deterministic way when the core 200 is dormant. The circuit 210 may be a simple implementation requiring no architectural changes and no complicated circuitry. The circuit 210 may provide fast awakening of the core 200 since the $V_{ccv}$ 205 is not starting from an extremely low level. The fast awakening results in less cost in terms of dynamic power.

The circuit 210 may enable the $V_{ccv}$ 205 to be programmable. The predictable $V_{ccv}$ 205 can be programmed, for example using a fuse to include or exclude additional transistors 242, for a given product specification. A programmable $V_{ccv}$ 205 may be useful since the $V_{ccv}$ 205 applied may vary depending on circumstances. For example, a $V_{ccv}$ 205 of $2V_{tn}$ may be desirable in some situations while in other situations it may be desirable to have a $V_{ccv}$ 205 of $3V_{tn}$. A programmable $V_{ccv}$ 205 may enable the application of different voltages for be different levels of activity in the core 200 (e.g., fully active, sleep, deep sleep, drowsy).

Figure 3:
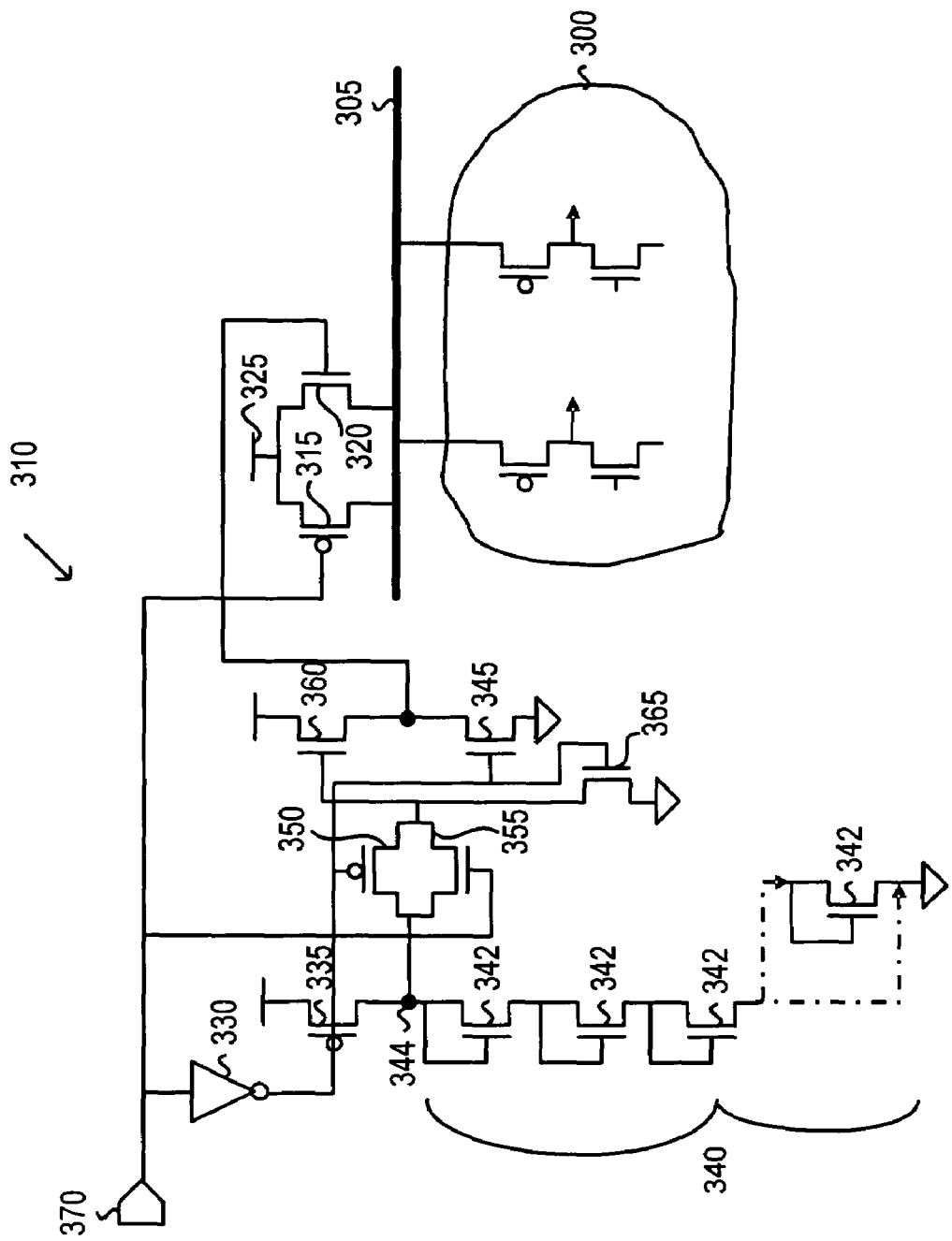
FIG. 3 illustrates a schematic of an example programmable power gating circuit, according to one embodiment.

FIG. 3 illustrates an example schematic of a programmable power gating circuit 310 for controlling power to a circuit core 300. The circuit 310 may be similar to the circuit 210 in that it may include a power transistor 315 (e.g., PMOS), a sleep transistor 320 (e.g., NMOS), an inverter 330, a sleep initialization transistor 335 (e.g., PMOS), a stack 340 of reference voltage transistors 342 (e.g., NMOS) connected as diodes, and a sleep disable transistor 345 (e.g., NMOS). The circuit 310 may further include transistor 350 (e.g., PMOS) and transistor 355 (e.g., NMOS) connected in parallel as a pass gate, a driving transistor 360, and a transistor 365 (e.g., NMOS). A sleep signal is received at an input 370 (hereinafter the signal received at the input 370 will be referenced as sleep signal 370) may be provided to the power transistor 315, the inverter 330 and the transistor 355. An inverted sleep signal may be provided to the sleep initialization transistor 335, the sleep disable transistor 345, the transistor 350 and the transistor 365. The input of the pass gate may be $V_{ref}$ 344 (actual voltage not illustrated, rather for simplicity a node having the voltage is simply illustrated) and the output is provided to the driving transistor 360. The power transistor 315 and the sleep transistor 320 are connected between 325 and the core 300 and provide $V_{ccv}$ 305 to the core 300.

The use of pass gate (transistors 350, 355) and the driving transistor 360 are for reaching target voltage levels faster. The pass gate acts to control the application of $V_{ref}$ 344 and the driving transistor 360 acts to drive $V_{ref}$ 344 or ground to the sleep transistor 320 depending on the operational state of the IC. The transistors 342 of the stack 340 may be relatively small compared to the driving transistor 360 and the sleep transistor 320.

When the sleep signal 370 is inactive (e.g., IC actively operating) and the inverted sleep signal is active, the power transistor 315, the sleep disable transistor 345 and the transistor 365 are ON and the sleep initialization transistor 335 and the pass gate are OFF. The driving transistor 360 is accordingly connected to ground via the transistor 365 and is accordingly OFF. The sleep transistor 320 is accordingly connected to ground via the sleep disable transistor 345 and is accordingly be OFF. Accordingly, the $V_{ccv}$ 305 applied to the core 300 may be approximately the $V_{cc}$ 325 provided via the power transistor 315.

When the sleep signal is active 370 (e.g., the IC is in sleep mode) and the inverted sleep signal is inactive, the power transistor 315, the sleep disable transistor 345, and the transistor 365 are OFF and the sleep initialization transistor 335 and the pass gate are ON. The driving transistor 360 is accordingly connected to the $V_{ref}$ 344 generated by the transistors 342 in the stack 340 and accordingly be ON. The output of the driving transistor 360 is reduced by the $V_{tn}$ of the driving transistor 360 and may be approximately $V_{ref}-V_{tn}$. The output of the driving transistor 360 is provided to the sleeping transistor 320 and the sleeping transistor is accordingly ON. The output of the sleeping transistor is the $V_{ccv}$ 305 and is the voltage applied to the gate by the driving transistor 360 reduced by the $V_{tn}$ of the sleep transistor 320 so that the $V_{ccv}$ 305 is approximately $V_{ref}-2V_{tn}$.

In order to provide a sufficient $V_{ccv}$ 305 during sleep mode the $V_{ref}$ 344 may be at least $3V_{tn}$ (3 transistors 342 in the stack 340) to account for the reduction of $V_{tn}$ of the driving transistor 360 and the sleep transistor 320. As illustrated, the top three transistors 342 in the stack 340 are connected via dashed lines to the bottom transistor 342 of the stack 340 as well as to ground to show that the inclusion of more than three transistors 342 may be optional. The choice of how many transistors 342 to use in the stack 340 depends on the $V_{ccv}$ 305 to be applied to the core logic 300 for the particular operational state of the core logic 300. Each additional transistor 342 in the stack 340 increases the $V_{ccv}$ 305 applied to the core 300 by $V_{tn}$.

The IC may have various levels of activity for which power provided to the core may be reduced (e.g., sleep, deep sleep). The different levels of inactivity may require different voltage levels be applied to the core. For example, a sleep mode may provide a voltage that may maintain states in the core while a deep sleep may provide minimal power so that the states are not maintained.

Figure 4:
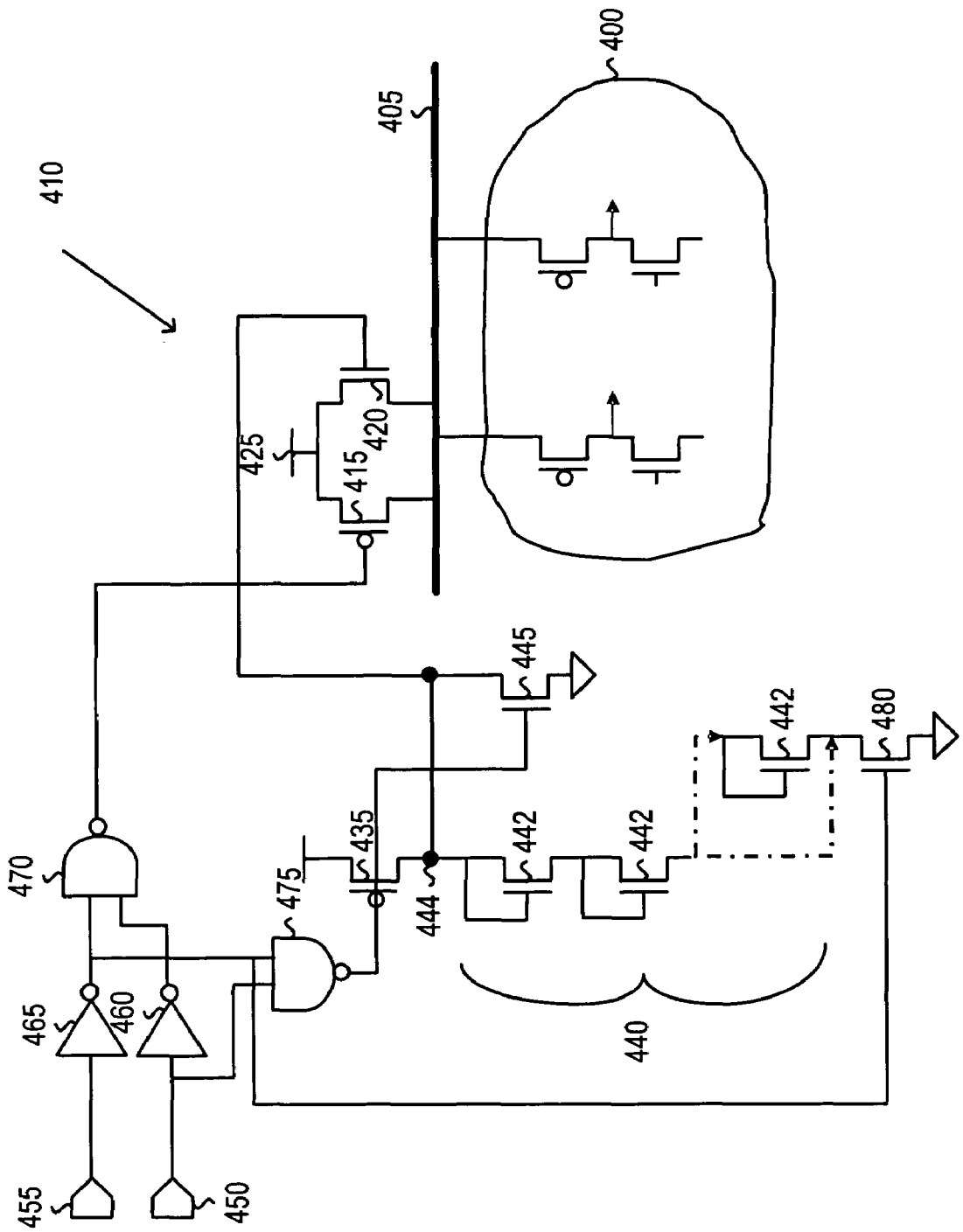
FIG. 4 illustrates a schematic of an example programmable power gating circuit for multiple control signals, according to one embodiment.

FIG. 4 illustrates an example schematic of a programmable power gating circuit 410 for controlling power to a circuit core 400 for different modes of operation (e.g., sleep, deep sleep). The circuit 410 may be similar to circuit 210 in that it may include a power transistor 415 (e.g., PMOS), a sleep transistor 420 (e.g., NMOS), a sleep initialization transistor 435 (e.g., PMOS), a stack 440 of reference voltage transistors 442 (e.g., NMOS) connected as diodes, and a sleep disable transistor 445 (e.g., NMOS). Sleep and deep sleep signals may be received at inputs 450, 455 respectively (hereinafter the signals received at the inputs 450, 455 will be referenced as sleep 450 and deep sleep 455 respectfully). The sleep 450 and deep sleep 455 signals may indicate the state of an IC and are utilized to control a $V_{ccv}$ 405 applied to the core 400.

The power transistor 415 may be ON when the core 400 is active or fully operational (e.g., neither sleep 450 nor deep sleep 455 active) so that the $V_{ccv}$ 405 provided to the core 400 may be approximately $V_{cc}$ 425 provided via the power transistor 415. The power transistor 415 may be OFF when the core is not fully operational (e.g., in a sleep or deep sleep mode) so that the $V_{ccv}$ 405 provided to the core 400 is based on the voltage provided to the sleep transistor 420. The sleep and deep sleep signals 450, 455 may be inverted by invertors 460, 465 respectively and the inverted signals may be provided to a NAND gate 470. The output of the NAND gate 470 may be provided to the gate of the power transistor 415 to control the operation of the power transistor 415. The power transistor 415 may be ON if neither the sleep or deep sleep signals 450, 455 are active and may be OFF if either signal 450, 455 is active. It should be noted that other circuitry (e.g., a NOR gate) could be used in place of the invertors 460, 465 and the NAND gate 470.

The sleep enable transistor 435 may be ON and the sleep disable transistor 445 may be OFF and $V_{ref}$ 444 (illustrated simply as a node) generated from the stack 440 of transistors 442 may be applied to the sleep transistor 420 if the IC is in sleep mode (the sleep signal 450 is active) and the $V_{ccv}$ 405 provided to the core 400 may be $V_{ref}-V_{tn}$ of the sleep transistor 420. If the IC is active or is in deep sleep mode the sleep enable transistor 435 may be OFF and the sleep disable transistor 445 may be ON and ground may be provided to the sleep transistor 420 via the sleep disable transistor 445 and the sleep transistor 420 may be OFF.

In order to control the sleep enable transistor 435 and the sleep disable transistor 445 in this manner the sleep signal 450 and the inverted deep sleep signal may be provided to a NAND gate 475 and an output of the NAND gate 475 may be provided to the sleep enable transistor 435 and the sleep disable transistor 445.

The circuit 410 may include a transistor 480 (e.g., NMOS) that may receive the inverted deep sleep signal so that when the IC is in deep sleep mode the transistor 480 is OFF thus removing the connection of the stack 440 to ground and eliminating possible leakage. Accordingly, when the IC is in deep sleep mode both the power transistor 415 and the sleep transistor 420 are OFF so that the $V_{ccv}$ 405 may settle at the leakage voltage of the power transistor 415 and the leakage voltage may be so low that the state of the core 400 may not be maintained.

Figure 5:
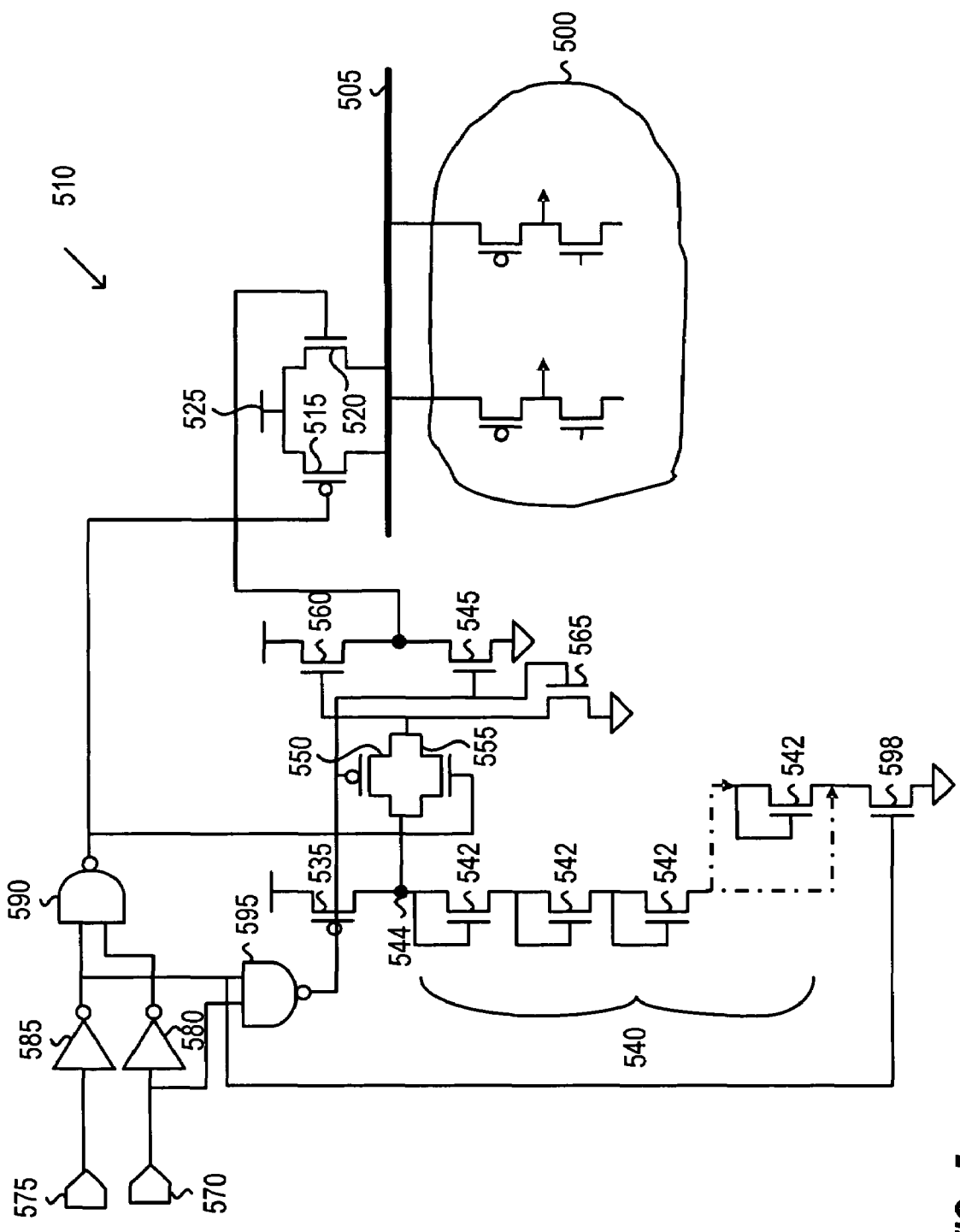
FIG. 5 illustrates a schematic of an example programmable power gating circuit for multiple control signals, according to one embodiment.

FIG. 5 illustrates an example schematic of a circuit 510 for controlling power to a circuit core 500 for different modes of operation. The circuit 510 may be similar to the circuit 310 in that it may include a power transistor 515 (e.g., PMOS), a sleep transistor 520 (e.g., NMOS), a sleep initialization transistor 535 (e.g., PMOS), a stack 540 of reference voltage transistors 542 (e.g., NMOS) connected as diodes, a sleep disable transistor 545 (e.g., NMOS), a transistor 550 (e.g., PMOS) and a transistor 555 (e.g., NMOS) connected in parallel as a pass gate, a driving transistor 560, and a transistor 565 (e.g., NMOS).

Sleep and deep sleep signals may be received at inputs 570, 575 respectively (hereinafter the signals received at the inputs 570, 575 will be referenced as sleep 570 and deep sleep 575 respectfully). The sleep 570 and deep sleep 575 signals may indicate the state of the IC and may in conjunction with various circuits (e.g., invertors 580, 585, NAND gates 590, 595) control application of the $V_{ccv}$ 505 to the core 500 circuitry. When the IC is active the power transistor 515 will be ON and the $V_{ccv}$ 505 will be approximately equal to $V_{cc}$ 525. When the IC is in sleep mode the sleep transistor 520 will be ON and $V_{ccv}$ 505 will be approximately $V_{ref}$ 544–$2V_{tn}$. When the IC is in deep sleep mode both the power transistor 515 and the sleep transistor 520 will be OFF and $V_{ccv}$ 505 will settle at the leakage voltage of the power transistor 515.

The circuit 510 may include a transistor 580 (e.g., NMOS) that may receive the inverted deep sleep signal and be used to eliminate possible leakage of the reference voltage transistors 542 when the IC is in deep sleep.

Advantages of the programmable power gate circuits (e.g. 210, 310, 410, 510) include, but are not limited to: (1) programmability, so that an acceptable deterministic level of leakage can be set, (2) ability to achieve low leakage, (3) precise power specification of a given product, (4) eliminate the need for external registers that save the machine states, (5) makes waking up the machine easier and faster waking of the core.

It should be noted that the programmable power gating circuits have been described with respect to gating the power to a core circuit when the core logic is in a sleep or deep sleep mode based on receipt of sleep or deep sleep signals but are limited thereto. Rather the programmable power gating circuits can be used for any reduced capacity state or combination of reduced capacity states without departing from the scope of the various embodiments described herein. Furthermore, the programmable power gating circuits could operate based on receipt of other signals, such as signals that the core is operational (e.g., fully, partially), without departing from the scope. Moreover, the programmable power gating circuits could gate power to non-core circuitry (e.g., other active circuits, peripherals, communications) without departing from the scope.

The programmable power gating circuits may be used in any type of IC to reduce power consumption. The programmable power gating circuits may be utilized in mobile ICs that require batteries to provide the power as reducing the power consumption will save the battery life. Mobile ICs may be used in any number of mobile devices including, but not limited to, laptop computers, cell phones, personal digital assistants (PDAs), gaming consoles, and portable entertainment devices. The mobile devices may include one or more mobile processors to operate the device. The processors may include on die memory, may utilize off die memory, or some combination thereof. The mobile devices may include an antenna for communications and a battery for power.

Figure 6:
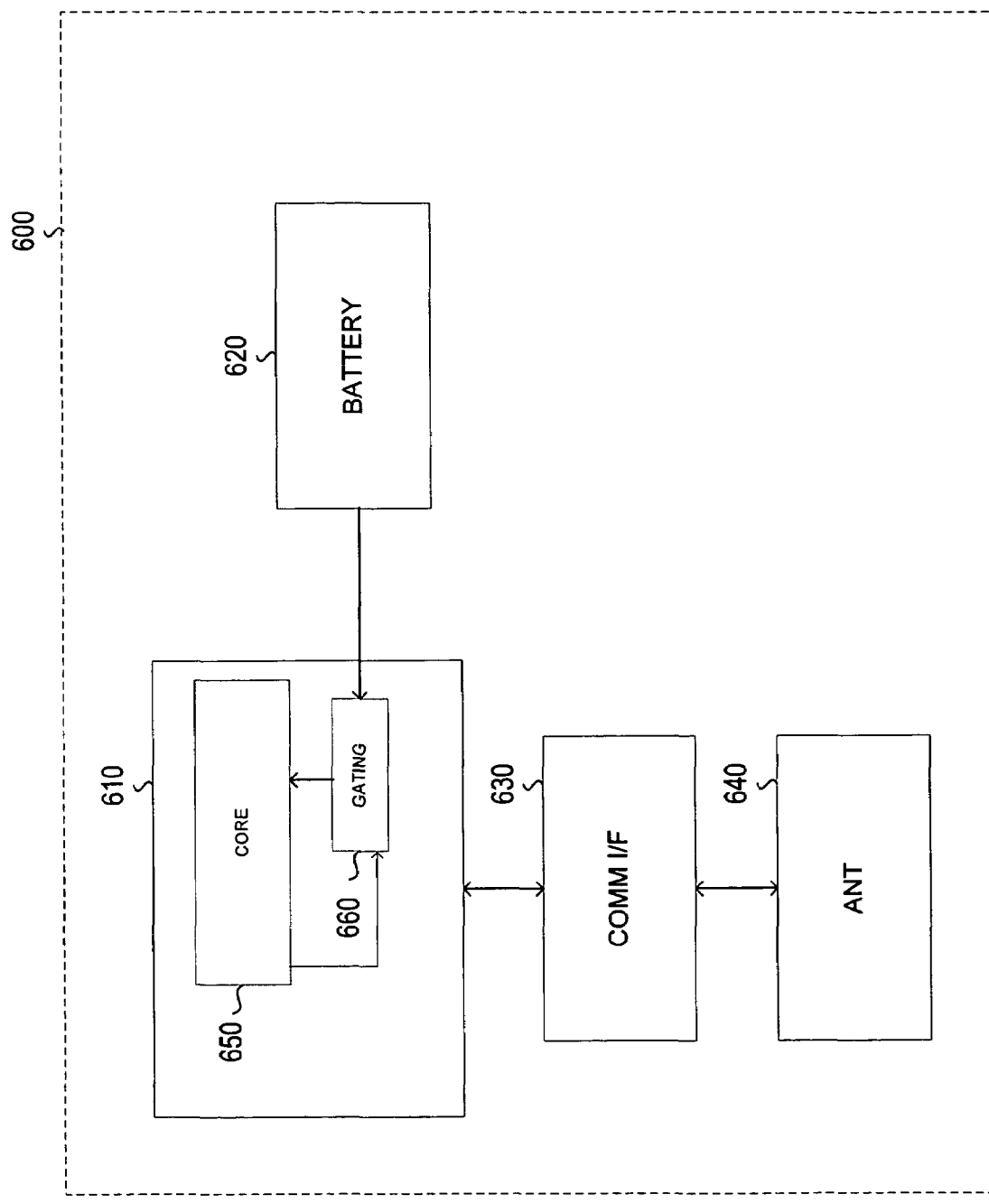
FIG. 6 illustrates a functional diagram of an example system utilizing a programmable power gating circuit; according to one embodiment.

FIG. 6 illustrates an example functional diagram of a system 600 utilizing a programmable power gating circuit (e.g., 210, 310, 410, 510). The system 600 includes a processor (IC) 610 to perform operations, a battery 620 to provide power to the processor 610, a communications interface 630 and an antenna 640 to provide wireless communications. The processor 610 may include active circuitry 650 (core) and programmable power gating circuitry 660. The power from the battery 620 may be applied to the programmable power gating circuitry 660 and the programmable power gating circuitry 660 may provide the power to the active circuit 650. The programmable power gating circuitry 660 may receive one of more control signals (e.g., sleep, deep sleep) from the active circuitry 650 to control how the programmable power gating circuitry 660 gates the power provided to the active circuitry 650.

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

Different implementations may feature different combinations of hardware, firmware, and/or software. It may be possible to implement, for example, some or all components of various embodiments in software and/or firmware as well as hardware, as known in the art. Embodiments may be implemented in numerous types of hardware, software and firmware known in the art, for example, integrated circuits, including ASICs and other types known in the art, printed circuit broads, components, etc.

The various embodiments are intended to be protected broadly within the spirit and scope of the appended claims.

What is claimed:

1. A programmable power gating circuit comprising
   a reference voltage generator to generate a reference voltage, wherein said reference voltage generator is a transistor stack and the reference voltage is based on number of transistors in the transistor stack; and
   a voltage selector, coupled between a voltage source and active circuitry, to gate application of the voltage source to the active circuitry and provide a certain voltage to the active circuitry when the active circuitry is in a reduced capacity mode, wherein the certain voltage is based on the reference voltage.

2. The gate of claim 1, wherein the reduced capacity mode is a sleep mode and the certain voltage is sufficient to maintain states in the active circuitry.

3. The gate of claim 1, wherein the number of transistors in the transistor stack is programmable.

4. The gate of claim 1, wherein said voltage selector includes a first transistor to receive a signal indicating if the active circuitry is in a reduced capacity mode, and wherein the first transistor is to gate application of the supply voltage to the active circuitry when the signal indicates the active circuitry is in a reduced capacity mode.

5. The gate of claim 4, wherein said voltage selector further includes a second transistor coupled to said reference voltage generator, and wherein the second transistor is to receive the reference voltage and to supply the certain voltage to the active circuitry.

6. The gate of claim 5, further comprising at least one enable/disable transistor to control when the reference voltage is applied to the second transistor.

7. The gate of claim 5, wherein the certain voltage is the reference voltage reduced by threshold voltage of the second transistor.

8. The gate of claim 1, further comprising a pass gate and a power transistor coupled between said reference voltage generator and said voltage selector.

9. The gate of claim 1, wherein multiple reduced capacity signals are received and voltage applied to the active circuitry is based on the multiple reduced capacity signals.

10. The gate of claim 1, wherein the active circuitry is core logic circuitry.

11. An integrated circuit comprising
    a core logic circuit;
    an input to receive an operational voltage from a voltage source; and
    a programmable power gating circuit to control a voltage supplied to the core logic circuit, wherein during a sleep mode the operational voltage is gated and a sleep voltage is supplied, wherein the sleep voltage is sufficient to maintain states in the core logic circuit, wherein said programmable power gating circuit includes
       a reference voltage generator to generate a reference voltage, wherein the reference voltage generator is a transistor stack, wherein the reference voltage is based on number of transistors in the transistor stack, and wherein the number of transistors in the transistor stack is programmable; and
       a voltage selector, coupled between said input and said core logic circuit, to gate the operational voltage and provide the sleep voltage to the core logic circuit when the core logic circuit is in a reduced capacity mode, wherein the sleep voltage is based on the reference voltage.

12. The circuit of claim 11, wherein the programmable power gating circuit is coupled between said core logic circuit and said input.

13. An integrated circuit comprising
    a core logic circuit;
    an input to receive an operational voltage from a voltage source; and
    a programmable power gating circuit to control a voltage supplied to the core logic circuit, wherein during a sleep mode the operational voltage is gated and a sleep voltage is supplied, wherein the sleep voltage is sufficient to maintain states in the core logic circuit, and wherein said programmable power gating circuit includes
    an input to receive a sleep signal indicating if said core logic circuit is in a sleep mode;
    a power transistor to gate the operational voltage if the sleep signal indicates said core logic circuit is in a sleep mode;
    a transistor stack to generate a reference voltage if the sleep signal indicates said core logic circuit is in a sleep mode; and
    a sleep transistor to provide a sleep voltage to the core logic circuit based on the reference voltage.

14. A system comprising
a processor die including active circuitry and programmable power gating circuitry, wherein the programmable power gating circuitry is used to control a voltage supplied to the active circuitry, wherein during a sleep mode an operational voltage is gated and a sleep voltage is supplied, wherein the sleep voltage is sufficient to maintain states in the active circuitry, and wherein the reference voltage generator is a transistor stack, wherein the reference voltage is based on number of transistors in the transistor stack, and wherein the number of transistors in the transistor stack is programmable; and
a battery to provide power to the processor die.

15. The system of claim 14, further comprising an antenna for communications.

16. The system of claim 14, wherein the programmable power gating circuitry includes
a power transistor to gate the operational voltage if the active circuitry is in a sleep mode;
a reference voltage generator to generate a reference voltage if the active circuitry is in a sleep mode; and
a sleep transistor to provide a sleep voltage to the active circuitry based on the reference voltage.

* * * * *